United States Patent [19]

Morimoto

[11] Patent Number: 5,359,494
[45] Date of Patent: Oct. 25, 1994

[54] MOUNTING STRUCTURE OF PIEZOELECTRIC ELEMENT

[75] Inventor: Ryoichi Morimoto, Kyoto, Japan

[73] Assignee: Murata Mfg. Co., Ltd., Kyoto, Japan

[21] Appl. No.: 134,415

[22] Filed: Oct. 8, 1993

[30] Foreign Application Priority Data

Oct. 13, 1992 [JP] Japan .................... 4-077526[U]
Jan. 8, 1993 [JP] Japan .................... 5-002825[U]

[51] Int. Cl.⁵ ............. H05K 7/02; H01L 41/04
[52] U.S. Cl. .................... 361/760; 361/768; 361/771; 310/348; 310/349; 310/313 R
[58] Field of Search ......... 361/760, 761, 763, 764, 361/766, 767, 768, 770, 771; 310/313 R, 348, 349; 257/779, 782, 783

[56] References Cited

U.S. PATENT DOCUMENTS 4,967,166 10/1990 Marcellus .................... 310/348

FOREIGN PATENT DOCUMENTS 4077010 3/1992 Japan .................... 310/348

Primary Examiner—Leo P. Picard
Assistant Examiner—Bot Ledynh
Attorney, Agent, or Firm—Rogers, Howell & Haferkamp

[57] ABSTRACT

An opening 11 is formed in a region of a circuit board 10 opposite to a vibration region E of a piezoelectric element 5. The piezoelectric element 5 is mounted on the circuit board 10, and electrode connection portions 9 of the piezoelectric element 5 are connected with and fixed to the circuit board by a solder. In succession, soldered connection portions kept away from the vibration region E of the piezoelectric element 5 are filled with a bonding agent 8. Thereupon, an excess bonding agent 8 with which the soldered connection portions are filled is eliminated by the opening 11, and hence is prevented from invading the vibration region E of the piezoelectric element 5. Further, any stress exerted on the circuit board 10 is dispersed because of its being mostly received by the bonding agent 8, and hence any stress exerted on the piezoelectric element 5 is reduced.

6 Claims, 3 Drawing Sheets

5,359,494

MOUNTING STRUCTURE OF PIEZOELECTRIC ELEMENT

BACKGROUND OF THE INVENTION

1. Field of the Invention

The present invention relates to a mounting structure of a piezoelectric element mounted on a circuit board.

2. Description of the Prior Art

Extended use is made of some electronic parts such as piezoelectric filters which utilize piezoelectric effect.

Such piezoelectric filters include surface elastic wave filters which utilize propagation of surface elastic waves.

Referring to FIG. 1, there is illustrated a chip type surface wave filter as an example of a piezoelectric element. The piezoelectric element 5 includes connecting electrodes 9 formed in the vicinity of opposite ends of an element body, and a vibration region located between the connecting electrodes 9. The piezoelectric element 5 uses a glass plate 15 as an element substrate on which comb electrodes are provided. A zinc oxide (ZnO) film 18 is formed so as to cover the comb electrode for formation of the vibration region E of the piezoelectric element 5.

The piezoelectric element 5 has its length L and its width W greater than the former and further has a ratio L/W ranging from 3 to 5 to exhibit its elongated structure.

For prior practice to mount the piezoelectric element 5 on a circuit board the piezoelectric element 5 is directly connected with and fixed to the circuit board 10 through a solder 7. This produces a problem that any application of mechanical or thermal stress to the circuit board 10 causes any of them to be directly exerted to the piezoelectric element 5 through connection portions. The piezoelectric element 5, which has the elongated structure, is therefore likely to be bent in the direction of the length thereof, i.e., an arrow B in FIG. 1 as the stress is exerted thereon, and the piezoelectric element 5, which is formed with the glass plate 15, is hard and fragile and hence is likely to be cracked in the vicinity of the solder connection portions. There is further produced another problem of the solder 7 being exfoliated to result in the electric characteristics of the piezoelectric element 5 being deteriorated.

Further, there is produced another problem that upon mounting the piezoelectric element 5 on a resin substrate and the like, thermal expansion coefficients of the glass and the resin are different from each other (thermal expansion coefficient of the glass is of $3 \sim 5 \times 10^{-6}$ while that of the glass epoxy resin being of $15 \times 10^{-6}$) and hence any stress due to the difference between the thermal expansion coefficients might be a cause to produce any crash in the piezoelectric element 5.

SUMMARY OF THE INVENTION

To solve the problems with the prior art, it is an object of the present invention to provide a mounting structure of a piezoelectric element wherein no greater stress is exerted on the piezoelectric element even though it is rendered to any mechanical or thermal stress from the circuit board and hence no crack is produced, and wherein electric characteristics of the piezoelectric element are not deteriorated.

To achieve the above object, a mounting structure of a piezoelectric element according to the present invention comprises connecting electrodes disposed longitudinally of an element body in the vicinity of opposite ends of the same, and a piezoelectric element in which a vibration region is formed between both said connecting electrodes, and a circuit board to which said piezoelectric element is directly fixed by connecting said connecting electrodes with said circuit board directly through a solder, and is characterized in that a bonding agent is applied on surrounding regions of the soldered connection portions between the connecting electrodes and the circuit board for fixing the piezoelectric element and the circuit board in a united manner, said surroundings regions being kept away from the vibration region of the piezoelectric element.

The mounting structure of a piezoelectric element according to the present invention is further characterized in that it includes invasion prevention means disposed on the circuit board for preventing the bonding agent applied on the surrounding regions of the soldered connection portions from invading into the vibration region of the piezoelectric element.

In accordance with the present invention, there is filled with a bonding agent for fixing the circuit board and the piezoelectric element in a united manner the surrounding regions of the soldered connection portions between the piezoelectric element and the circuit board in a region kept away from the vibration region of the piezoelectric element, so that any mechanical or thermal stress to the circuit board, although being applied to the piezoelectric element through the soldered connection portions, is disposed because of most part of the stress being received by the bonding agent, and hence the stress applied to the piezoelectric element is reduced. Hereby, there is prevented any crack in the piezoelectric element from being produced, and hence there is prevented electric characteristics of the piezoelectric element from being deteriorated owing to the stress.

Further, in accordance with the present invention, there is disclosed an excess bonding agent applied onto the soldered connection portions through the bonding agent invasion prevention means disposed on the side of the circuit board and hence there is prevented the bonding agent from invading and adhering to the vibration region of the piezoelectric element.

BRIEF DESCRIPTION OF THE DRAWINGS

The above and other objects, features and advantages of the present invention will be better understood from reading the following description of the preferred embodiments taken in conjunction with the accompanying drawings in which.

DETAILED DESCRIPTION OF PREFERRED EMBODIMENTS

In what follows, there will be described some embodiments of a mounting structure of a piezoelectric element according to the present invention with reference to the accompanying drawings. Identical symbols in the description of the present embodiments shall be applied to identical portions to those of the prior art example, and hence the overlapped detailed description thereof will be omitted.

Figure 1:
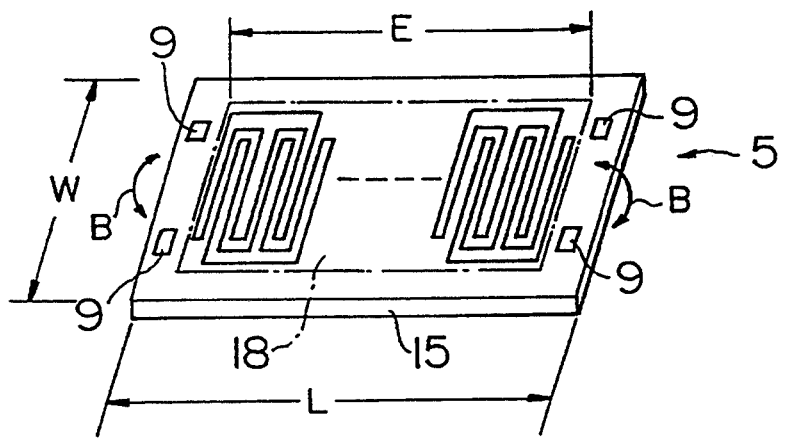
FIG. 1 is a perspective view illustrating a piezoelectric element.
Figure 2:
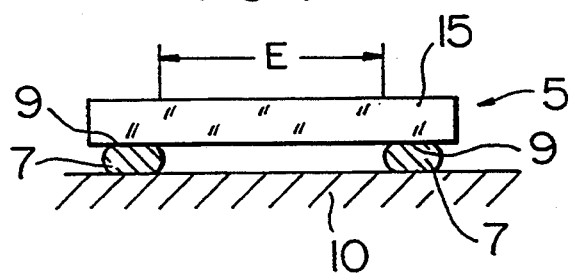
FIG. 2 is a view illustrating a prior art mounting structure of a piezoelectric element.
Figure 3:
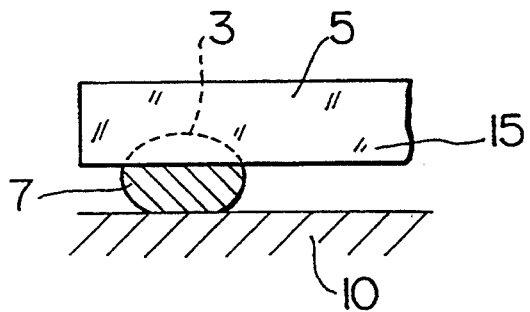
FIG. 3 is a view illustrating inconvenience of the prior art mounting structure of a piezoelectric element.

Referring now to FIG. 1, there is illustrated a mounting structure of a piezoelectric element according to the first embodiment of the present invention.

The first embodiment is characterized in that surrounding regions of soldered connection portions between the piezoelectric element and the circuit board are filled with a bonding agent to reduce stress which might be exerted on the soldered connection portions.

Figure 4:
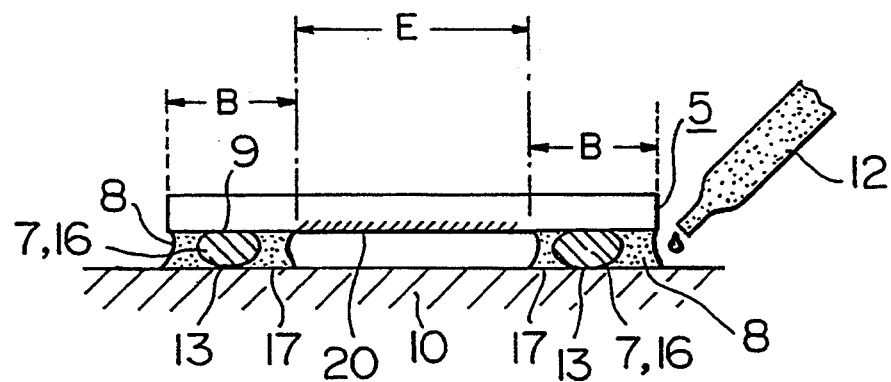
FIG. 4 is a view illustrating a mounting structure of a piezoelectric element according to a first embodiment of the present invention.

Referring to FIG. 4, the piezoelectric element 5 allows connecting electrodes 9 to be formed on opposite ends of an element body, between which electrodes 9 a vibration region E is formed. The piezoelectric element 5 is directly connected with and fixed to a circuit board 10 by connecting the connecting electrodes 9 with the circuit board 10 through a solder. The surrounding regions B of the soldered connection portions kept away from the vibration region E of the piezoelectric element 5 are filled with a bonding agent such as thermosetting resin for example.

There will be described the operation of mounting the piezoelectric element 5 constructed as above on the circuit board 10. First, solder cream for example is applied on solder connected portion regions 13 on the side of the circuit board. The piezoelectric element 5 is mounted on the circuit board 10 in a predetermined position relation with the vibration region E located underside thereof for solder connection therebetween through reflowing. Hereby, the piezoelectric element 5 is mounted on the circuit board. Otherwise, solder bumps 16 are formed by previously supplying a solder 7 on the connecting electrodes 9 of the piezoelectric element 5, and then the piezoelectric element 5 is mounted on the circuit board 10. Both members are thereafter heated together to melt the solder bumps 16 for the mounting of the piezoelectric element 5 on the circuit board 10.

In succession, there are filled surrounding regions 17 of the solder connection portion regions 1, which are kept away from the vibration region E of the piezoelectric element 5, are filled with a bonding agent 8 comprising thermosetting resin, etc., to distribute any stress exerted on the soldered connection portions with the aid of a dispenser 12 for example.

In the present embodiment, the surrounding regions 17 of the solder connection portions between the piezoelectric element 5 and the circuit board 10 are filled with the bonding agent 8 serving to disperse any stress exerted on the soldered connection portions. Accordingly, any mechanical or thermal stress exerted on the circuit board 10 is dispersed and reduced mostly by the bonding agent 8 even though it is applied to the piezoelectric element 5 through the soldered connection portions. Thus, a fear of the piezoelectric element 5 being cracked is eliminated to result in an improvement of the resistance to bending of the board as well as elimination of any exfoliation of the solder, without deterioration of electric characteristics of the piezoelectric element which might otherwise be caused by the stress.

Although the piezoelectric element is likely to be cracked in the prior art in the case of the use of a resin board as the circuit board 10 because of a greater thermal expansion coefficients therebetween, in the present embodiment any stress from the circuit board 10 is dispersed through the bonding agent 8 and hence any stress which might otherwise be exerted on the piezoelectric element 5 is reduced. Accordingly, a fear of the piezoelectric element 5 being cracked is eliminated and hence the resistance of the same against thermal shock is improved, say no trouble is caused even with use of a resin board such for example as a glass epoxy board.

Figure 5A:
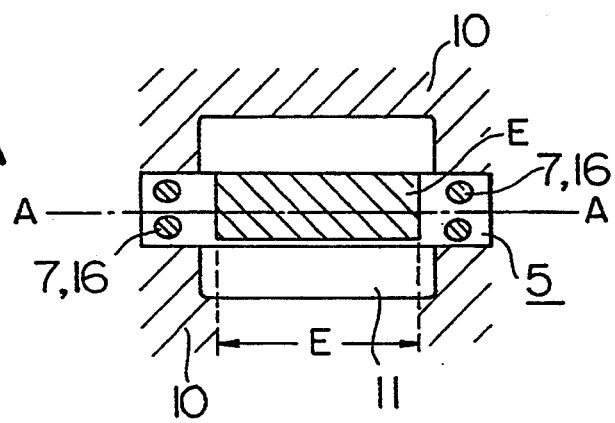
FIG. 5A is a plan view illustrating a mounting structure of a piezoelectric element according to the present invention.
Figure 5B:
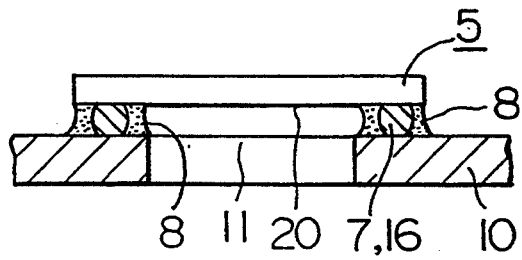
FIG. 5B is a side view illustrating the mounting structure of FIG. 5A.

Referring to FIGS. 5A and 5B, there is illustrated a mounting structure of a piezoelectric element according to a second embodiment of the present invention. The embodiment is provided as a result of a further improvement of the first embodiment, in which an opening 11 as bonding agent prevention means is formed in a region of the circuit board 10 opposite to the vibration region E of the piezoelectric element 5 while penetrating the circuit board 10, and hence an excess bonding agent 8 is prevented from invading and adhering to the vibration region E when the surrounding regions of the soldered connection portions are filled with the bonding agent 8.

In the second embodiment, the opening 11 is formed in the region of the circuit board 10 opposite to the vibration region E of the piezoelectric element 5. Accordingly, an excess bonding agent 8 is discharged to the outside when the bonding agent 8 is applied and hardened around the soldered connection portions to prevent the bonding agent 8 from invading and adhering to the vibration region E of the piezoelectric element 5.

There is a fear of the characteristics of the piezoelectric element being deteriorated provided resin such as the bonding agent 8 adheres to the vibration region E of the piezoelectric element 5, but in the present embodiment there is ensured no adhesion of the bonding agent 8 to the vibration region E to prevent the characteristics of the piezoelectric element 5 from being deteriorated. Additionally, any mechanical or thermal stress is dispersed, if it is exerted on the circuit board 10, by the bonding agent 8 to ensure the identical advantage to that of the first embodiment.

Figure 6A:
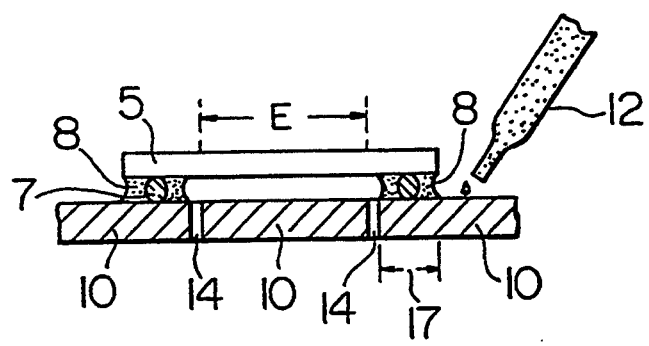
FIG. 6A is a plan view illustrating a mounting structure of a piezoelectric element according to the present invention.
Figure 6B:
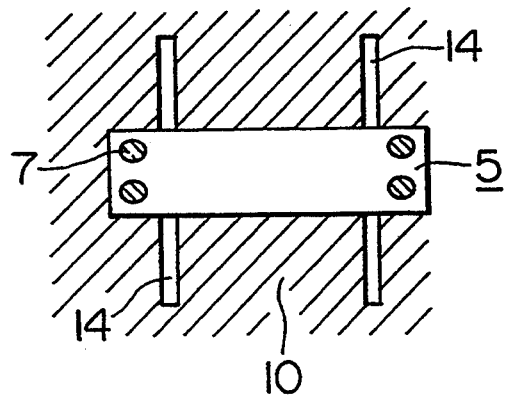
FIG. 6B is a side view illustrating the mounting structure of FIG. 6A.

Referring to FIGS. 6A, a side view, and 6B, a plan view, there is illustrated a third embodiment of the present invention. Although in the second embodiment, the opening 11 is formed in the circuit board 10 as a measure to prevent the bonding agent 8 from invading and adhering to a lower portion 20 of the vibration region E of the piezoelectric element 5, any groove 14 may be provided as disclosed in the present embodiment in the circuit board 10 at a boundary between the vibration region E and the surrounding region 17 of the soldered connection portion. Hereby, the bonding agent 8 may be prevented as well from going around the vibration region E of the piezoelectric element 8.

It should be noticed that although in the aforementioned embodments use is made of the thermal resin as the bonding agent 8, use may be made of thermoplastic resin for example, and further use may be made of arbitrary insulating materials if stress dispersion is allowed therewith.

Further, although in the aforementioned embodiments a piezoelectric element was demonstrated by way of example, the present invention may be applied to other elements such as diodes and optical detector elements which are mountable on a circuit board with the same mounting technique.

In accordance with the present invention, the surrounding regions of the soldered connection portions between the piezoelectric element and the circuit board are filled with a bonding agent, so that any mechanical or thermal stress is dispersed by the bonding agent even though they are exerted on the circuit board, and hence any stress applied to the piezoelectric element is reduced. Thus, a fear of the piezoelectric element being cracked is eliminated, and hence electric characteristics of the piezoelectric element are prevented from being deteriorated owing to the stress.

Additionally, there is provided bonding agent invasion prevention means on a region of the circuit board opposite to the vibration region of the piezoelectric element, so that an excess bonding agent is removed by the bonding agent invasion prevention means upon the bonding agent being applied to and hardened around the soldered connection portions, and hence is prevented from invading and adhering to the vibration region of the piezoelectric element. Thus, a fear of the characteristics of the piezoelectric element being deteriorated is eliminated.

What is claimed is:

1. A mounting structure of a piezoelectric element comprising:

connecting electrodes each disposed in the vicinity of opposite ends of an element body longitudinally of the same;

said piezoelectric element having a vibration region formed between both said connecting electrodes of the element body; and a circuit board to which said connecting electrodes are directly connected and fixed through a solder, the improvement being such that a bonding agent is applied to surrounding regions of soldered connection portions between the piezoelectric element and the circuit board for fixing said circuit board and said piezoelectric element in a united manner being kept away from said vibration region of said piezoelectric element.

2. A mounting structure of a piezoelectric element according to claim 1 wherein invasion prevention means is provided on the circuit board for preventing the bonding agent filled in the surrounding regions of the soldered connection portions from invading the vibration region of the piezoelectric element.

3. A mounting structure of a piezoelectric element according to claim 2 wherein said invasion prevention means is an opening formed in a region opposed to said vibration region of the piezoelectric element on the circuit board.

4. A mounting structure of a piezoelectric element according to claim 2 wherein said invasion prevention means is a groove formed in the circumference of the vibration region of the piezoelectric element on the circuit board.

5. A mounting structure of a piezoelectric element according to claim 1 wherein said circuit board is a glass plate.

6. A mounting structure of a piezoelectric element according to claim 1 wherein said circuit board is made of resin.

* * * * *